United States Patent [19]
Wu

[11] Patent Number: 6,020,609
[45] Date of Patent: Feb. 1, 2000

[54] DRAM CELL WITH A RUGGED STACKED TRENCH (RST) CAPACITOR

[75] Inventor: Shye-Lin Wu, Hsinchu, Taiwan

[73] Assignee: Texas Instruments - Acer Incorporated, Hsinchu, Taiwan

[21] Appl. No.: 08/962,003

[22] Filed: Oct. 31, 1997

[51] Int. Cl.[7] ................................................. H01L 27/108
[52] U.S. Cl. .................. 257/309; 257/296; 257/301; 257/304; 257/311; 438/255
[58] Field of Search .................. 257/296, 301, 257/304, 307, 309, 311; 438/255

[56] References Cited

U.S. PATENT DOCUMENTS

| | | | |
|---|---|---|---|
| 4,921,816 | 5/1990 | Ino | 257/304 |
| 5,066,609 | 11/1991 | Yamamoto et al. | 357/301 |
| 5,124,765 | 6/1992 | Kim et al. | 257/309 |
| 5,187,550 | 2/1993 | Yanagisawa | 257/304 |
| 5,216,265 | 6/1993 | Anderson et al. | 257/301 |
| 5,223,730 | 6/1993 | Rhodes et al. | 257/301 |
| 5,225,698 | 7/1993 | Kim et al. | 257/301 |
| 5,349,218 | 9/1994 | Tadaki et al. | 257/301 |
| 5,352,913 | 10/1994 | Chung et al. | 257/301 |
| 5,386,131 | 1/1995 | Sato | 257/296 |
| 5,411,911 | 5/1995 | Ikeda et al. | 437/52 |
| 5,432,732 | 7/1995 | Ohmi | 437/52 |
| 5,498,889 | 3/1996 | Hayden | 257/296 |
| 5,594,682 | 1/1997 | Lu et al. | 257/296 |
| 5,662,768 | 9/1997 | Rostoker | 257/301 |
| 5,701,022 | 12/1997 | Kellner et al. | 257/301 |

*Primary Examiner*—Mahshid Saadat
*Assistant Examiner*—Hanh Tran
*Attorney, Agent, or Firm*—Harness, Dickey & Pierce, P.L.C.

[57] ABSTRACT

The trench capacitors formed in a semiconductor wafer include trenches formed in said semiconductor substrate, first storage nodes includes doped ion regions and doped polysilicon structures, the doped regions are formed in a surface of the trenches. The doped polysilicon structures are formed on the walls of the trenches. An isolation structure is formed on said substrate between said trenches for isolation. A dielectric layer substantially covers the first storage nodes. A field plate is formed on the isolation structure and Second storage nodes is formed in the trenches and on the dielectric layer.

18 Claims, 4 Drawing Sheets

DRAM CELL WITH A RUGGED STACKED TRENCH (RST) CAPACITOR

FIELD OF THE INVENTION

The present invention relates to a method of fabricating a semiconductor device, and more specifically, to a method of forming a Dynamic Random Access Memory (DRAM) cell. Still more particularly, the present invention relates to a method of forming an improved capacitor for a DRAM cell.

BACKGROUND

In recent years, the development of a high density memory cell is being carried out. Particularly, a Dynamic Random Access Memories (DRAM) has been remarkably developed in terms of packing density and the DRAM is widely used in computer technology. Typically, the DRAM cells are applied to store data for a computer. Indeed, a memory cell is provided for each bit stored by the DRAM device. The cells must therefore be read and refreshed at periodic intervals. These memory cells have large capacitance for reading out and storing of information. Dynamic Random Access Memories are so named because their cells can retain information only temporarily, even with power continuously applied.

Each memory cell typically consists of a storage capacitor and an access transistor. The formation of a DRAM memory cell includes the formation of a transistor, a capacitor and contacts to external circuits. Generally speaking, the capacitors for DRAM are divided into two segments, those are a stacked capacitor and a trench capacitor. One of the prior arts in accordance with the trench capacitor can be seen "A 0.6 $\mu m^2$ 256 Mb Trench DRAM Cell With Self-Aligned BuriEd STrap (BEST), L. Nesbit et al., 1993, IEEE, IEDM 93–627." A unique feature of this cell is a self-aligned buried strap which forms at the intersection of the storage trench and the junction of the array device. However, it is difficult to make deep trenches with a high aspect ratio for high density DRAMs. Further, another major concern of the trench capacitor is leakage current. As the trench size is reduced to sub micron range, the trench to trench punch through leakage is a serious issues for the DRAM cell. Other leakage, such as surface channel leakage between cells, gate-induced diode leakage, trench side wall diode leakage are also occur while the cell is scaled down. Thus, it is difficult to reduce the leakage current of the trench capacitor. See "SCALABILITY OF A TRENCH CAPACITOR CELL FOR 64 MBIT DRAM, B. W. Shen, et al., 1989, IEEE, IEDM 89–27."

In addition, one approach discloses that a polysilicon can be textured by wet oxidation and subsequent wet etching. The oxidation is enhanced at polysilicon grain boundaries, this method increases the effective area of a capacitor. Please see "Thin Nitride Films on Textured Polysilicon to Increase Multimegabit DRAM Cell Charge Capacitor, PIERRE C. FAZAN et al., 1990, IEEE." The present invention also uses a method to diffuse ions into silicon substrate. This method is proposed by V. Probst, see "Analysis of Polysilicon Diffusion Sources, V. Probst et al., J. Electrochem. Soc. SOLID-STATE SCIENCE AND TECHNOLOGY, Vol. 135, No. 3, p. 671."

SUMMARY

In accordance with the present invention, a method of manufacturing a capacitor is provided. In one embodiment adapted for use in a DRAM cell will be described as follow.

A thermal silicon oxide layer and silicon nitride layer are respectively formed on the substrate. A trench is then created in the substrate. A doped polysilicon layer is deposited on the silicon nitride layer and along the surface of the trench. A texturing process is then performed to texturize the doped polysilicon layer. An oxide layer is simultaneously formed on the surface of the textured polysilicon layer. Further, the aforesaid wet oxidation also causes the ions that in the doped polysilicon layer to diffuse into the silicon substrate. Then, the oxide layer on the textured polysilicon layer is removed by diluted HF solution or the like. Next, the textured polysilicon layer is etched back by using anisotropic etch to expose the silicon nitride layer. An ion implantation process is performed with titled angle to dope ions into the trench. A dielectric layer is then deposited along the surface of the textured polysilicon layer, on the silicon oxide layer, silicon nitride layer. Afterwards, a conductive layer is deposited on the dielectric layer and refilled into the trench using a conventional LPCVD process.

The trench capacitors formed in a semiconductor wafer include trenches formed in said semiconductor substrate, first storage nodes includes doped ion regions and doped polysilicon structures, the doped regions are formed in a surface of the trenches. The doped polysilicon structures are formed on the walls of the trenches. An isolation structure is formed on said substrate between said trenches for isolation. A dielectric layer substantially covers the first storage nodes. A field plate is formed on the isolation structure and Second storage nodes is formed in the trenches and on the dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

In the present invention, a new method is disclosed to increase the area of a DRAM cell capacitor by using a textured polysilicon technology. Polysilicon diffusion source technique is used extensively in an embodiments of the present invention. The formation of the trench DRAM cell includes many process steps that are well known in the art. For example, the processes of lithography masking and etching are also used herein.

Figure 1:
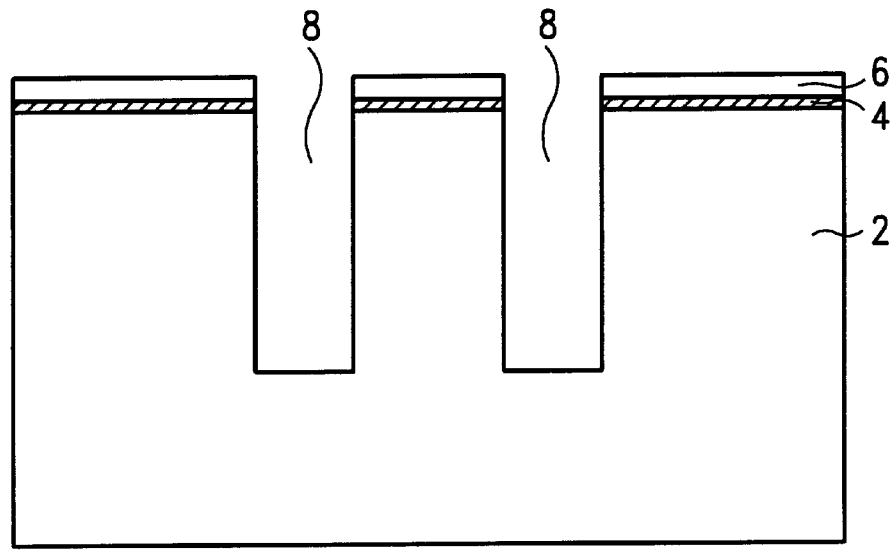
FIG. 1 is a cross-sectional view of a semiconductor wafer illustrating the steps of forming trenches in a substrate according to one embodiment of the present invention.

Referring to FIG. 1, a single crystal silicon substrate 2, preferably, with a <100> crystallographic orientation is provided. A thermal silicon oxide layer 4 of 30 to hundreds angstroms is formed on the substrate 2 to act as a pad layer. The pad oxide is formed to reduce the stress between the silicon substrate 2 and a subsequent silicon nitride layer. The pad oxide layer can also be formed by any suitable chemical vapor deposition. Subsequently, a silicon nitride layer 6 is then formed on the silicon oxide layer 4 to have a thickness approximate 1500–2000 angstroms. Then, the silicon oxide 4, the silicon nitride layer 6 are patterned by well known lithography, leaving exposed areas where the capacitors will be formed in subsequent processes. In a case, a photoresist is patterned on the silicon nitride layer 6 to define at least one trench region. One or more first trenches 8 are then created in the substrate 2 by using the photoresist as an etching mask to etch the silicon oxide layer 4, the silicon nitride layer 6 and the substrate 2. The first trenches 8 can be generated by using etching, such as plasma etching or RIE (reactive ion etch).

Figure 2:
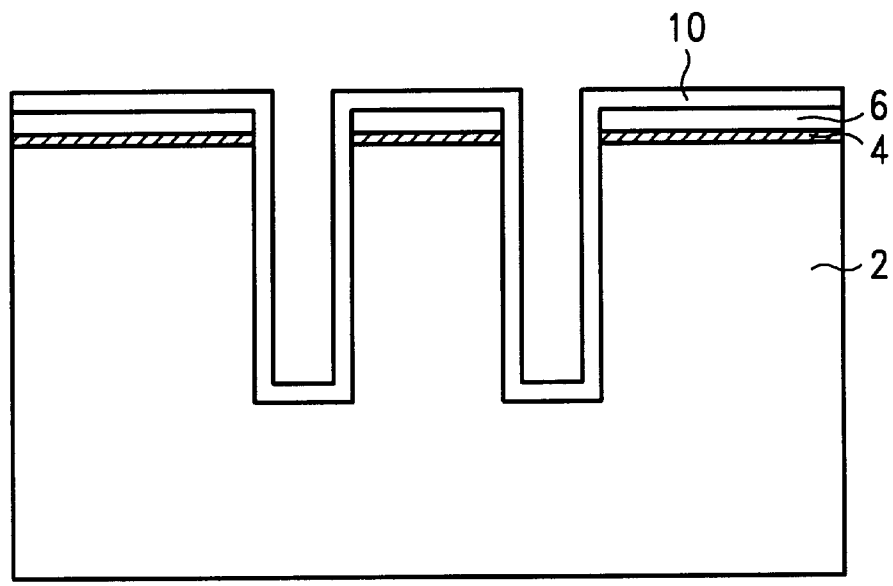
FIG. 2 is a cross-sectional view of a semiconductor wafer illustrating the steps of forming an n+ doped polysilicon layer in the trenches according to one embodiment of the present invention.
Figure 3:
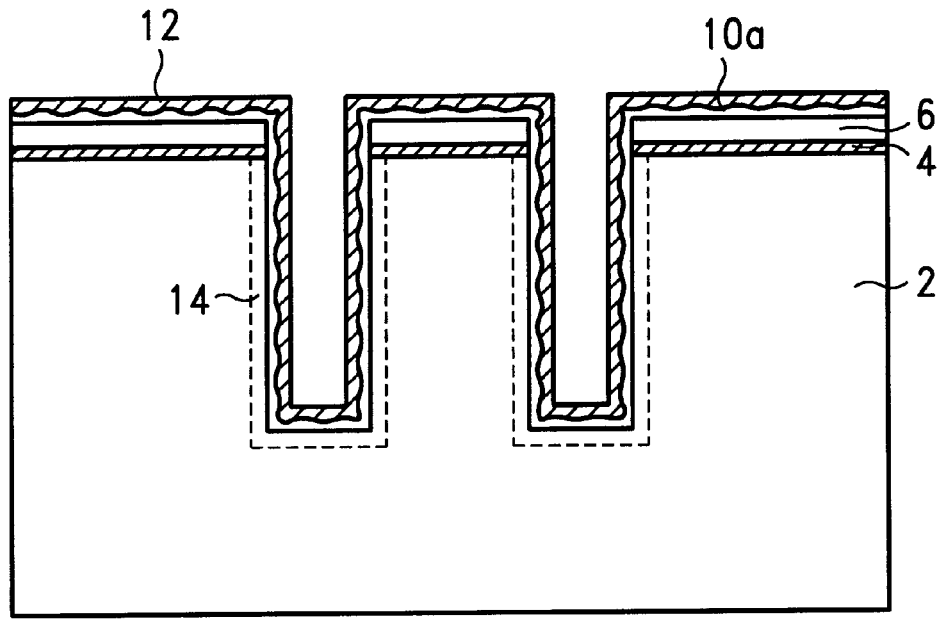
FIG. 3 is a cross-sectional view of a semiconductor wafer illustrating the steps of texturing the doped polysilicon layer and forming doped ion region according to one embodiment of the present invention.

Turning to FIG. 2, an n+ doped polysilicon layer 10 is deposited on the silicon nitride layer 6 and along the surface of the trenches 8. For an embodiment, the doped polysilicon layer 10 is doped by phosphorus using a $PH_3$ source. The thickness of the polysilicon layer 10 ranges from 200 to 1500 angstroms. In addition, the doped polysilicon layer 10 is selected from doped polysilicon or in-situ doped polysilicon. Turning next to FIG. 3, a texturing process is then perform to texture the doped polysilicon layer 10. This can be achieved by a low temperature wet oxidation in oxygen ambient at a temperature about 650 to 1000 centigrade degrees. The oxidation is enhanced at polysilicon grain boundaries, the oxidation rate of the grain boundaries is faster than grain itself. Thus, the surface of the doped polysilicon layer 10 is textured and the doped polysilicon layer 10a with a rugged surface that will increase an effect area for a capacitor. An oxide layer 12 is simultaneously formed on the surface of the textured polysilicon layer 10a due to the wet oxidation is performed.

Figure 4:
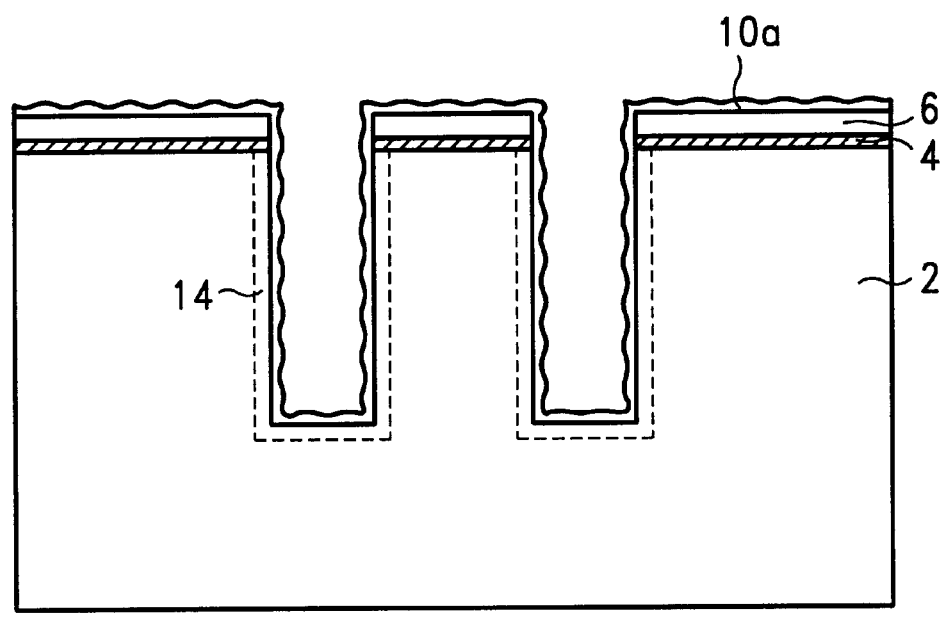
FIG. 4 is a cross-sectional view of a semiconductor wafer illustrating the step of removing a oxide layer according to one embodiment of the present invention.

Further, the aforesaid wet oxidation also causes the ions that in the doped polysilicon layer 10 to diffuse into the silicon substrate 2, thereby forming a doped ion region 14 in the silicon substrate 2 adjacent to the surface of the trenches 8. Referring to FIG. 4, after the doped polysilicon layer 10 and the doped ion region 14 are formed, the oxide layer 12 on the doped polysilicon layer 10 is removed by diluted HF solution or the like.

Figure 5:
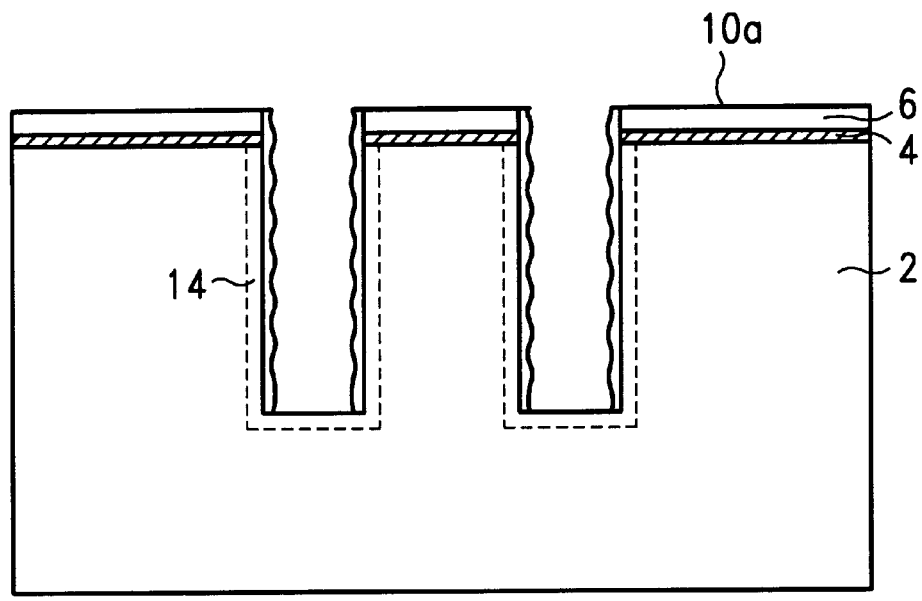
FIG. 5 is a cross-sectional view of a semiconductor wafer illustrating the steps of etching the textured polysilicon layer according to one embodiment of the present invention.

Next, as shown in FIG. 5, the textured polysilicon layer 10a is etched back by using anisotropic etch to expose the silicon nitride layer 6. The silicon nitride layer 6 is used as hard mask during the etching step. Residual doped polysilicon layer 10 remains on the side wall of the trenches 8.

Figure 6:
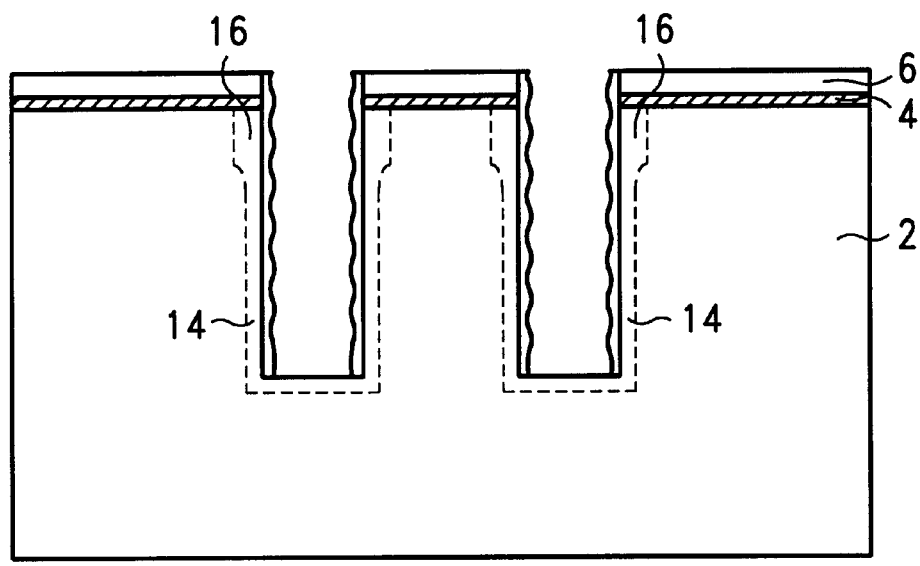
FIG. 6 is a cross-sectional view of a semiconductor wafer illustrating the step of performing an ion implantation according to one embodiment of the present invention.

Turning to FIG. 6, then, an ion implantation process is performed with at least two tilted angle with respect to the surface of the substrate 2 to dope ions, such as arsenic or the like, into the surface of the trenches 8 for forming drains 16 for a subsequent transistor. The drains 16 locate at the top of the doped ion region 14.

The step can be obtained by using large-angle-titled-drain (LATID) implantation. The doped ion regions 14 and the textured polysilicon layer 10a serve as a first storage node of the trench capacitor. The trench capacitor having rugged surface storage node is referred to a rugged stacked trench (RST) capacitor.

Figure 7:
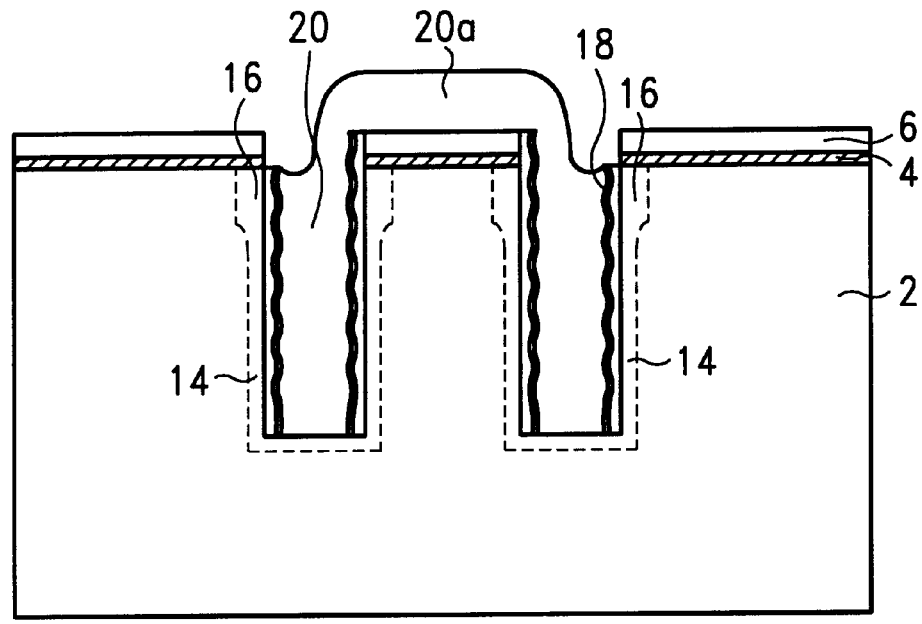
FIG. 7 is a cross-sectional view of a semiconductor wafer illustrating the steps of forming a dielectric film and a conductive layer according to one embodiment of the present invention.

Turning to FIG. 7, a dielectric layer 18 is then conformally deposited along the surface of the first storage node, on the silicon oxide layer 4, silicon nitride layer 6. The dielectric layer 18 can be formed of a silicon nitride, silicon oxide double-film, a silicon oxide, silicon nitride, silicon oxide triple-film, or any other high dielectric film such as tantalum oxide ($Ta_2O_5$), BST, PZT. Afterwards, a conductive layer 20 is deposited on the dielectric layer 18 and refilled into the trenches 8 using a conventional LPCVD process. The conductive layer 20 is used as a second storage node of the capacitor. The conductive layer 20 is preferably either doped polysilicon or in-situ doped polysilicon. Metal or metal alloy may serve as the conductive layer 20. A portion of the conductive layer 20 is formed on a first portion of the silicon nitride layer 6 that is formed between trenches 8. The portion of the conductive layer 20 formed on the first portion of the silicon nitride layer 6 acts as a field plate 20 of the capacitor.

Figure 8:
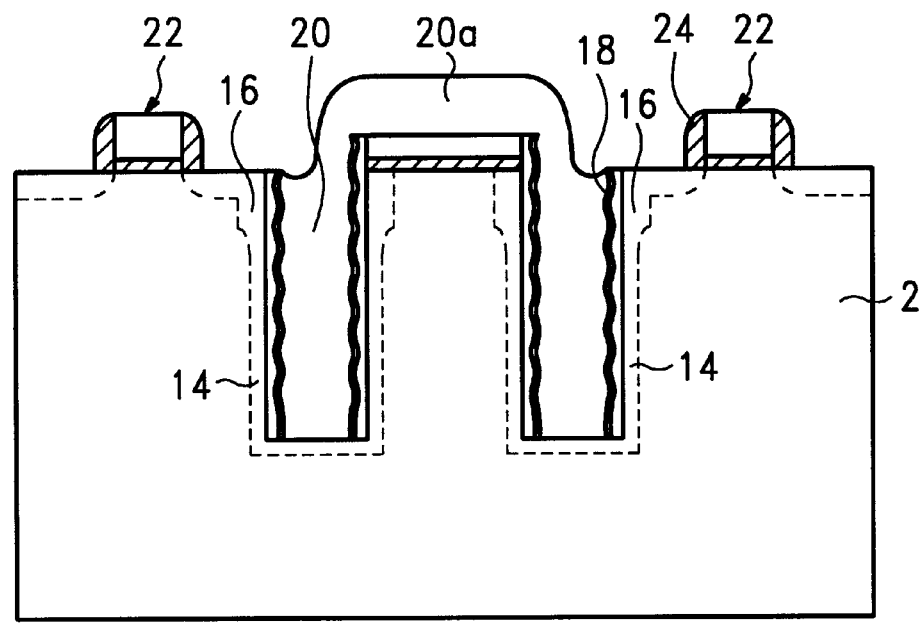
FIG. 8 is a cross-sectional view of a semiconductor wafer illustrating the steps of forming transistors on the substrate according to one embodiment of the present invention.

Turning to FIG. 8, a second portion of the silicon nitride layer 6 and a portion of the silicon oxide layer 4 that is not covered by the field plate 20 are removed. Finally, at least one transistor 22 is formed on the substrate 2 by well known technology and connected to the capacitor by doped ion region 24 of the transistor 22. This is well known in the art, thus only a cursory description is given herein.

Accordingly, the semiconductor capacitors are formed which has relatively large electrode surface area while occupying a relatively small area of the substrate. Therefore, the capacitors according to the present invention has a relatively large capacitance, thereby supporting good performance and high density.

As will be understood by persons skilled in the art, the foregoing embodiments of the present invention are illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

The embodiments of the invention in which an exclusive property or privilege is claimed are defined as follows:

1. Trench capacitors formed in a semiconductor substrate, said capacitors comprising:

trenches formed in said semiconductor substrate;

first storage nodes including doped ion regions and doped polysilicon structures having a rugged surface formed on the entire surface of said trench to increase a surface area, said doped regions being formed in a surface of said trenches, said doped polysilicon structures being formed on side walls of said trenches;

an isolation structure formed on said substrate between said trenches for isolation;

a dielectric layer substantially covering said first storage nodes;

a field plate formed on said isolation structure; and second storage nodes formed in said trenches and on said dielectric layer.

2. The capacitors of claim 1, wherein said doped polysilicon structures are chosen from the group consisting of doped polysilicon and in-situ doped polysilicon.

3. The capacitors of claim 1, wherein said dielectric layer is formed of $Ta_2O_5$.

4. The capacitors of claim 1, wherein said dielectric layer is formed of BST.

5. The capacitors of claim 1, wherein said dielectric layer is formed of PZT.

6. The capacitors of claim 1, wherein said dielectric layer is a triple film of silicon oxide, silicon nitride, silicon oxide.

7. The capacitors of claim 1, wherein said dielectric layer is a double film of silicon nitride, silicon oxide film.

8. The capacitors of claim 1, wherein said second storage node is chosen from the group consisting of doped polysilicon and in-situ doped polysilicon.

9. The capacitors of claim 1, wherein said second storage node is chosen from the group consisting of metal and alloy.

10. Trench DRAM cells formed in a semiconductor substrate, said capacitors comprising:

trenches formed in said semiconductor substrate;

first storage nodes including doped ion regions and doped polysilicon structures having a rugged surface formed on the entire surface of said trench to increase a surface area, said doped regions being formed in a surface of said trenches, said doped polysilicon structures being formed on side walls of said trenches;

an isolation structure formed on said substrate between said trenches for isolation;

a dielectric layer substantially covering said first storage nodes;

a field plate formed on said isolation structure;

second storage nodes formed in said trenches and on said dielectric layer; and at least one transistor formed on said semiconductor substrate and being connected to said doped ion region.

11. The capacitors of claim 10, wherein said doped polysilicon structures are chosen from the group of doped polysilicon and in-situ doped polysilicon.

12. The capacitors of claim 10, wherein said dielectric layer is formed of $Ta_2O_5$.

13. The capacitors of claim 10, wherein said dielectric layer is formed of BST.

14. The capacitors of claim 10, wherein said dielectric layer is formed of PZT.

15. The capacitors of claim 10, wherein said dielectric layer is a triple film of silicon oxide, silicon nitride, silicon oxide.

16. The capacitors of claim 10, wherein said dielectric layer is a double film of silicon nitride, silicon oxide film.

17. The capacitors of claim 10, wherein said second storage node is chosen from the group consisting of doped polysilicon and in-situ doped polysilicon.

18. The capacitors of claim 10, wherein said second storage node is chosen from the group consisting of metal and alloy.

* * * * *